(12) United States Patent
Lyu et al.

(10) Patent No.: US 10,269,771 B2
(45) Date of Patent: Apr. 23, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Li-Hao Lyu, Kaohsiung (TW); Chieh-Ju Tsai, Kaohsiung (TW); Yu-Kai Lin, Kaohsiung (TW); Wei-Ming Hsieh, Kaohsiung (TW); Yu-Pin Tsai, Kaohsiung (TW); Man-Wen Tseng, Kaohsiung (TW); Yu-Ting Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/675,612

(22) Filed: Aug. 11, 2017

(65) Prior Publication Data
US 2018/0061727 A1    Mar. 1, 2018

Related U.S. Application Data

(60) Provisional application No. 62/382,004, filed on Aug. 31, 2016.

(51) Int. Cl.
*H01L 23/48* (2006.01)
*H01L 25/065* (2006.01)
(Continued)

(52) U.S. Cl.
CPC ........ *H01L 25/0657* (2013.01); *H01L 21/561* (2013.01); *H01L 23/28* (2013.01);
(Continued)

(58) Field of Classification Search
CPC ................................................. H01L 2924/181
See application file for complete search history.

(56) References Cited

U.S. PATENT DOCUMENTS

| 7,476,980 B2 | 1/2009 | Rebibis et al. |
| 8,039,315 B2 | 10/2011 | Lee et al. |

(Continued)

FOREIGN PATENT DOCUMENTS

| CN | 102522341 A | 6/2012 |
| CN | 105552059 A | 5/2016 |
| JP | 2012-188555 A | 10/2012 |

OTHER PUBLICATIONS

Non-Final Office Action for related U.S. Appl. No. 15/675,617, dated Nov. 16, 2017.

(Continued)

*Primary Examiner* — Thao P Le
(74) *Attorney, Agent, or Firm* — Foley & Lardner LLP; Cliff Z. Liu

(57) ABSTRACT

A semiconductor device package comprises an adhesive layer, a die on the adhesive layer, a first encapsulation layer encapsulating the die and the adhesive layer, and a second encapsulation layer adjacent to the first encapsulation layer and the adhesive layer. The second encapsulation layer has a first surface and a second surface different from the first surface. A contact angle of the first surface of the second encapsulation layer is different from a contact angle of the second surface of the second encapsulation layer.

20 Claims, 18 Drawing Sheets

(51) Int. Cl.
  H01L 23/28    (2006.01)
  H01L 23/31    (2006.01)
  H01L 23/427   (2006.01)
  H01L 23/498   (2006.01)
  H01L 23/00    (2006.01)
  H01L 21/56    (2006.01)
  H01L 23/538   (2006.01)

(52) U.S. Cl.
  CPC ...... *H01L 23/3114* (2013.01); *H01L 23/3142* (2013.01); *H01L 23/427* (2013.01); *H01L 23/49816* (2013.01); *H01L 23/49838* (2013.01); *H01L 23/5389* (2013.01); *H01L 23/562* (2013.01); *H01L 24/19* (2013.01); *H01L 24/20* (2013.01); *H01L 23/3128* (2013.01); *H01L 2224/04105* (2013.01); *H01L 2224/12105* (2013.01); *H01L 2224/32225* (2013.01); *H01L 2224/73267* (2013.01); *H01L 2224/92244* (2013.01); *H01L 2224/97* (2013.01); *H01L 2225/06513* (2013.01); *H01L 2225/06586* (2013.01); *H01L 2924/1433* (2013.01); *H01L 2924/3511* (2013.01)

(56) References Cited

U.S. PATENT DOCUMENTS

| | | | |
|---|---|---|---|
| 9,177,926 | B2 | 11/2015 | Scanlan et al. |
| 9,190,367 | B1 | 11/2015 | Liao et al. |
| 9,269,622 | B2 | 2/2016 | Scanlan et al. |
| 9,337,086 | B2 | 5/2016 | Scanlan |
| 2008/0284017 | A1 | 11/2008 | Lee et al. |
| 2012/0153447 | A1 | 6/2012 | Jiang |

OTHER PUBLICATIONS

Office Action for corresponding Chinese Patent Application No. 201710755927.X, issued on Nov. 29, 2018 in 8 pages.

Translation of Search Report for corresponding Chinese Patent Application No. 201710755927.X, issued on Nov. 29, 2018 in 4 pages.

| Sample | Silicon wafer (Non-grinding) | Lower encapsulation layer 10 (Non-curing & Non-grinding) | Lower encapsulation layer 10 (Curing & Non-grinding) | Lower encapsulation layer 10 (Non-curing & Grinding) | Lower encapsulation layer 10 (Curing & Grinding) |
|---|---|---|---|---|---|
| Angle value | 63°~69° | 92°~108° | 92°~105° | 36°~39° | 39°~41° |

| Sample | Non-grinding | Sawing | Grinding |
|---|---|---|---|
| Contact angle | 104.4° | 55.7° | 39.5° |

FIG. 9

| Sample | Non-grinding | Sawing | Grinding |
|---|---|---|---|
| Roughness | 0.279μm | 0.214μm | 0.091μm |

FIG. 10

SEMICONDUCTOR DEVICE PACKAGE AND A METHOD OF MANUFACTURING THE SAME

CROSS-REFERENCE TO RELATED APPLICATIONS

This application claims the benefit of and priority to U.S. Provisional Application No. 62/382,004, filed Aug. 31, 2016, the content of which is incorporated herein by reference in its entirety.

BACKGROUND

1. Technical Field

The present disclosure relates to a semiconductor device package, and to a semiconductor device package having a mold compound carrier supporting semiconductor dies.

2. Description of the Related Art

In a semiconductor device package, a mold compound can be used to encapsulate semiconductor dies and/or other components on a substrate. A coefficient of thermal expansion (CTE) mismatch between the mold compound, the substrate, the semiconductor dies, and/or other components of the semiconductor device package may cause warpage, which may cause reliability issues for the semiconductor device package. To address such warpage issues, a quantity of fillers in the mold compound can be increased to mitigate the warpage; however, this may also increase viscosity of the mold compound which can hinder the molding operation. Another potential solution is to introduce relatively hard material (e.g. Naphthalene) into a resin of the mold compound; however, if there is deformation of such a relatively hard mold compound, it may be challenging to handle the subsequent operations (e.g. in a vacuum pickup transfer operation). Another potential solution to deal with the warpage issue may use a glass carrier which has good coplanarity, thermostability, acid-resistance and alkali-resistance. However, the glass carrier may be fragile and therefore easily broken during the manufacturing process. Another potential solution to deal with the warpage issue may use a metal carrier which is reusable and has low CTE when operating in a temperature range from, for example, about 20 degrees Celsius (° C.) to about 300° C. However, such a metal carrier can be expensive and can have relatively poor coplanarity. Moreover, extra bonding and de-bonding operations may be introduced into the manufacturing process when the metal carrier or the glass carrier is used, and accordingly, a cost of manufacture may be increased.

SUMMARY

In some embodiments, according to one aspect, a semiconductor device package comprises an adhesive layer, a die on the adhesive layer, a first encapsulation layer encapsulating the die and the adhesive layer, and a second encapsulation layer adjacent to the first encapsulation layer and the adhesive layer. The second encapsulation layer has a first surface and a second surface different from the first surface. A contact angle of the first surface of the second encapsulation layer is different from a contact angle of the second surface of the second encapsulation layer.

In some embodiments, according to another aspect, a semiconductor device package comprises an adhesive layer, a die on the adhesive layer, a first encapsulation layer encapsulating the die and the adhesive layer, and a second encapsulation layer adjacent to the first encapsulation layer and the adhesive layer. The second encapsulation layer has a first surface and comprises a first filler having a planar surface. The planar surface of the first filler is coplanar with the first surface of the second encapsulation layer.

In some embodiments, according to still another aspect, a method is disclosed for manufacturing a semiconductor device package. The method includes: providing a first encapsulation layer; forming an adhesive layer on the first encapsulation layer; disposing a die on the adhesive layer; and forming a second encapsulation layer covering the die, the adhesive layer, and the first encapsulation layer.

BRIEF DESCRIPTION OF THE DRAWINGS

FIG. 9 illustrates a table of contact angles of a surface of a mold compound carrier according to some embodiments of the present disclosure.

FIG. 10 illustrates a table of roughness values of one surface of a mold compound carrier according to some embodiments of the present disclosure.

DETAILED DESCRIPTION

Figure 1:
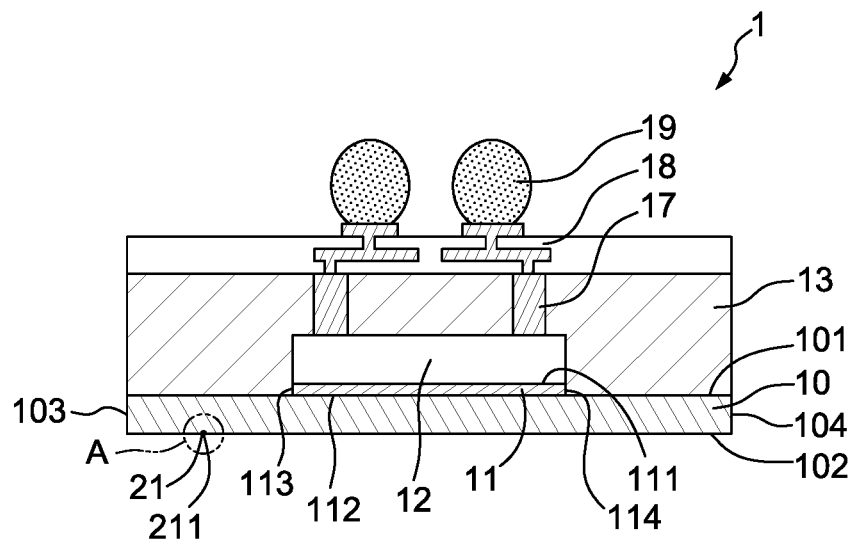
FIG. 1 illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of a semiconductor device package 1 in accordance with some embodiments of the present disclosure. The semiconductor device package 1 includes a lower encapsulation layer 10, an adhesive layer 11, a die 12, an upper encapsulation layer 13, an interconnection 17, a redistribution structure 18, and a solder ball 19.

The lower encapsulation layer 10 has a top surface 101, a bottom surface 102, a lateral surface 103, and a lateral surface 104. The top surface 101 is opposite to the bottom surface 102. The lateral surface 103 and the lateral surface 104 are opposite to each other. The adhesive layer 11 is disposed on the lower encapsulation layer 10.

The adhesive layer 11 has a top surface 111, a bottom surface 112, a lateral surface 113, and a lateral surface 114. The top surface 111 is opposite to the bottom surface 112. The lateral surface 113 and the lateral surface 114 are opposite to each other. The die 12 is attached to the lower encapsulation layer 10 via the adhesive layer 11. One of the lateral surfaces 113 and 114 of the adhesive layer 11 is substantially coplanar with a lateral surface of the electronic component 12.

The upper encapsulation layer 13 is disposed on the lower encapsulation layer 10 and encapsulates the die 12 and the adhesive layer 11.

The die 12 may include an application-specific integrated circuit (ASIC), a controller, a processor or other electronic component or semiconductor device.

The interconnection 17 is formed or disposed in the upper encapsulation layer 13 and electrically connected to the die 12. The interconnection 17 may include a conductive material, such as copper (Cu) or tin (Sn), another metal, or other suitable materials. The redistribution structure 18 is disposed on the upper encapsulation layer 13. The redistribution structure 18 covers at least a portion of the upper encapsulation layer 13 (e.g. completely covers the upper encapsulation layer 13).

The redistribution structure 18 is electrically connected to the die 12 via the interconnection 17.

The solder ball 19 is disposed on the redistribution structure 18 and is electrically connected to the die 12.

The lower encapsulation layer 10 may function as a mold compound carrier for supporting the die 12. The lower encapsulation layer 10 is adjacent to the upper encapsulation layer 13 and the adhesive layer 11. The lower encapsulation layer 10 includes an epoxy resin and silicon dioxide ($SiO_2$) fillers 21. A thickness of the lower encapsulation layer 10 can be set as appropriate. The thickness of the lower encapsulation layer 10 can be readily changed. For example, in some embodiments, the bottom surface 102 of the lower encapsulation layer 10 is grinded to a desired thickness. A contact angle of the bottom surface 102 of the lower encapsulation layer 10 is different from a contact angle of the top surface 101 of the lower encapsulation layer 10. For example, a contact angle of the bottom surface 102 of the lower encapsulation layer 10 is less than a contact angle of the top surface 101 of the lower encapsulation layer 10. In some embodiments, the top surface 101 of the lower encapsulation layer 10 can be grinded. The contact angle of the bottom surface 102 of the lower encapsulation layer 10 is different from a contact angle of the lateral surface 103 or 104 of the lower encapsulation layer 10. For example, the contact angle of the bottom surface 102 of the lower encapsulation layer 10 is less than a contact angle of the lateral surface 103 or 104 of the lower encapsulation layer 10.

The upper encapsulation layer 13 includes an epoxy resin. Material characteristics of the upper encapsulation layer 13 may be similar to those of the lower encapsulation layer 10. In some embodiments, a CTE of the upper encapsulation layer 13 is different from a CTE of the lower encapsulation layer 10. In some embodiments, the CTE of the upper encapsulation layer 13 is substantially the same as the CTE of the lower encapsulation layer 10. In some embodiments, the CTE of the upper encapsulation layer 13 is greater than the CTE of the lower encapsulation layer 10. In some embodiments, the CTE of the upper encapsulation layer 13 is less than the CTE of the lower encapsulation layer 10. In implementations in which the material characteristics (e.g. CTEs) of the upper encapsulation layer 13 are similar to or substantially the same as those of the lower encapsulation layer 10, CTE mismatch between the upper encapsulation layer 13 and the lower encapsulation layer 10 can be kept small. Thus the strength of the lower encapsulation layer 10 used as a mold compound carrier may be increased and the reliability of the lower encapsulation layer 10 can be stable during molding operations, which can help to avoid warpage issues and reduce the costs for manufacturing the semiconductor device package 1.

Figure 2:
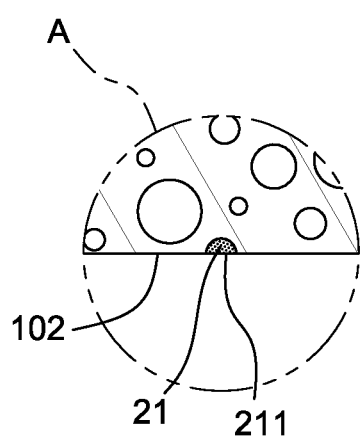
FIG. 2 illustrates an enlarged cross-sectional view of an encapsulation layer according to some embodiments of the present disclosure.

FIG. 2 is an enlarged cross-sectional view of the lower encapsulation layer 10 in a dotted-circle A illustrated in FIG. 1 according to some embodiments of the present disclosure. The lower encapsulation layer 10 includes the fillers 21. A size (e.g. a diameter) of the fillers 21 typically varies from about 10 micrometers (μm) to about 100 μm. In implementations in which the bottom surface 102 of the lower encapsulation layer 10 is grinded by a grinding technique, a substantially planar surface 211 of the filler 21 is exposed from the bottom surface 102 of the lower encapsulation layer 10. The planar surface 211 of the filler 21 is substantially coplanar with the bottom surface 102 of the lower encapsulation layer 10.

Figure 3:
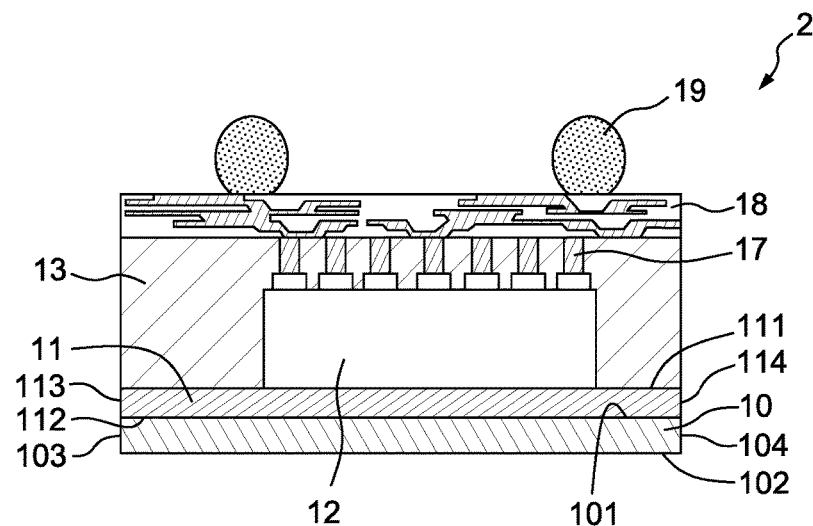
FIG. 3 illustrates a cross-sectional view of a semiconductor device package according to some embodiments of the present disclosure.

FIG. 3 is a cross-sectional view of a semiconductor device package 2 in accordance with some embodiments of the present disclosure. The semiconductor device package 2 includes a lower encapsulation layer 10, an adhesive layer 11, a die 12, an upper encapsulation layer 13, an interconnection 17, a redistribution structure 18, and a solder ball 19. The structure depicted in FIG. 3 is similar to the structure depicted in FIG. 1, except that the adhesive layer 11 extends beyond both lateral surfaces of the die 12.

The lower encapsulation layer 10 has a top surface 101, a bottom surface 102, a lateral surface 103, and a lateral surface 104. The top surface 101 is opposite to the bottom surface 102. The lateral surface 103 and the lateral surface 104 are opposite to each other.

The adhesive layer 11 is disposed on the lower encapsulation layer 10. The adhesive layer 11 has a top surface 111, a bottom surface 112, a lateral surface 113, and a lateral surface 114. The top surface 111 is opposite to the bottom surface 112. The lateral surface 113 and the lateral surface 114 are opposite to each other. The lateral surface 113 of the adhesive layer 11 is substantially coplanar with the lateral surface 103 of the lower encapsulation layer 10. The lateral surface 114 of the adhesive layer 11 is substantially coplanar with the lateral surface 104 of the lower encapsulation layer 10.

Similarly to the structure of the lower encapsulation layer 10 depicted in FIG. 1, the lower encapsulation layer 10 may function as a mold compound carrier for supporting the die 12. The lower encapsulation layer 10 is adjacent to the adhesive layer 11 and is disposed under the upper encapsulation layer 13. The lower encapsulation layer 10 includes an epoxy resin and fillers 21. The thickness of the lower encapsulation layer 10 can be set as appropriate. The thickness of the lower encapsulation layer 10 can be readily changed. For example, in some embodiments, the bottom surface 102 of the lower encapsulation layer 10 can be grinded to a desired thickness. A contact angle of the bottom surface 102 of the lower encapsulation layer 10 is different from a contact angle of the top surface 101 of the lower encapsulation layer 10. For example, a contact angle of the bottom surface 102 of the lower encapsulation layer 10 is less than a contact angle of the top surface 101 of the lower encapsulation layer 10. In some embodiments, the top surface 101 of the lower encapsulation layer 10 can be grinded. The contact angle of the bottom surface 102 of the lower encapsulation layer 10 is different from a contact angle of the lateral surface 103 or 104 of the lower encapsulation layer 10. For example, the contact angle of the bottom surface 102 of the lower encapsulation layer 10 is less than a contact angle of the lateral surface 103 or 104 of the lower encapsulation layer 10.

The upper encapsulation layer 13 includes an epoxy resin. Material characteristics of the upper encapsulation layer 13 may be similar to those of the lower encapsulation layer 10. In some embodiments, a CTE of the upper encapsulation layer 13 is different from a CTE of the lower encapsulation layer 10. In some embodiments, the CTE of the upper encapsulation layer 13 is substantially the same as the CTE of the lower encapsulation layer 10. In some embodiments, the CTE of the upper encapsulation layer 13 is greater than the CTE of the lower encapsulation layer 10. In some embodiments, the CTE of the upper encapsulation layer 13 is less than the CTE of the lower encapsulation layer 10. In implementations in which the material characteristics (e.g. CTEs) of the upper encapsulation layer 13 are similar to or substantially the same as those of the lower encapsulation layer 10, CTE mismatch between the upper encapsulation layer 13 and the lower encapsulation layer 10 can be kept small. Thus the strength of the lower encapsulation layer 10 used as a mold compound carrier may be increased and the reliability of the lower encapsulation layer 10 can be stable during molding operations, which can help to avoid warpage issues and reduce the costs for manufacturing the semiconductor device package 2.

Figure 4:
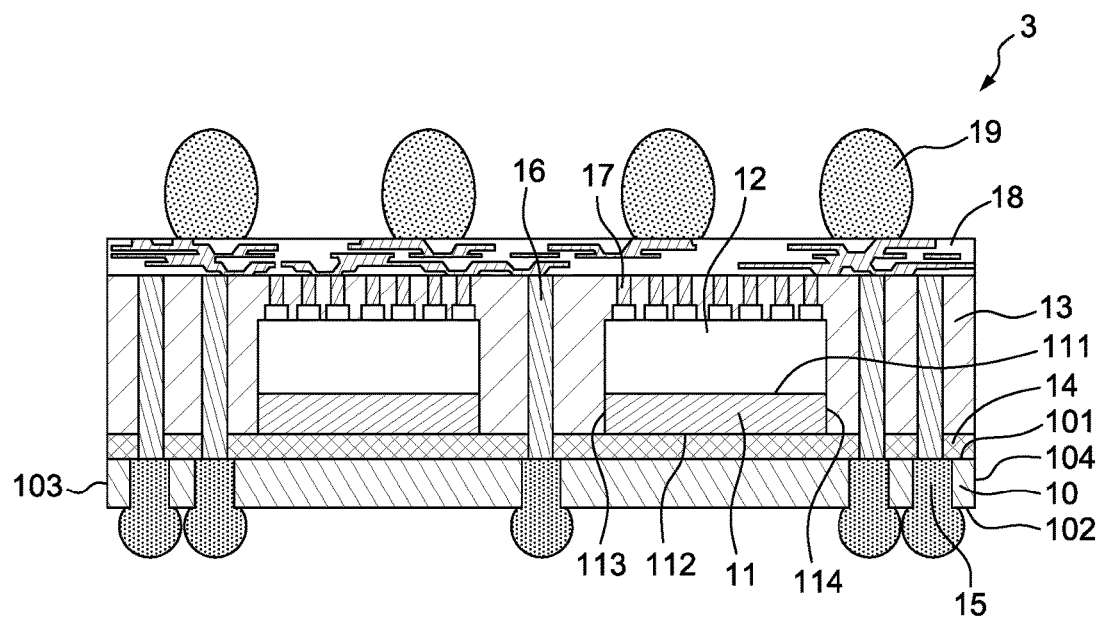
FIG. 4 illustrates a cross-sectional view of a semiconductor device package according to some embodiments of the present disclosure.

FIG. 4 is a cross-sectional view of a semiconductor device package 3 in accordance with some embodiments of the present disclosure. The semiconductor device package 3 includes a lower encapsulation layer 10, a conductive element 15, an insulation layer 14, an adhesive layer 11, a die 12, an upper encapsulation layer 13, a first interconnection 16, a second interconnection 17, a redistribution structure 18, and a solder ball 19.

The lower encapsulation layer 10 has a top surface 101, a bottom surface 102, a lateral surface 103, and a lateral surface 104. The top surface 101 is opposite to the bottom surface 102. The lateral surface 103 and the lateral surface 104 are opposite to each other. The lower encapsulation layer 10 defines an opening configured to receive the conductive element 15. In some embodiments, the conductive element 15 may include a solder paste, a solder ball, a joint material, or other suitable elements.

The insulation layer 14 is disposed on the lower encapsulation layer 10. One of the lateral surfaces of the insulation layer 14 is substantially coplanar with the lateral surface 103 or 104 of the lower encapsulation layer 10. In some embodiments, a redistribution layer may be disposed on the insulation layer 14 (e.g. directly on the insulation layer 14). In some embodiments, the insulation layer 14 may be replaced with a redistribution layer.

The die 12 is attached to the insulation layer 14 via the adhesive layer 11. The die 12 may include an application-specific integrated circuit (ASIC), a controller, a processor or other electronic component or semiconductor device.

The upper encapsulation layer 13 is disposed on the insulation layer 14 and encapsulates the adhesive layer 11, the die 12, and the insulation layer 14. The first interconnection 16 is disposed in the upper encapsulation layer 13.

The first interconnection 16 penetrates the upper encapsulation layer 13 and the insulation layer 14 and the first interconnection 16 is electrically connected to the conductive element 15 and the redistribution structure 18. The bottom surface of the first interconnection 16 is substantially coplanar with the bottom surface of the insulation layer 14. The top surface of the first interconnection 16 is substantially coplanar with the top surface of the upper encapsulation layer 13.

The second interconnection 17 is disposed in the upper encapsulation layer 13 and electrically connected to the die 12. The first interconnection 16 and the second interconnection 17 may include a conductive material, such as Cu, or Sn, another metal, or other suitable materials. The redistribution structure 18 is disposed on the upper encapsulation layer 13.

The redistribution structure 18 is electrically connected to the die 12 via the second interconnection 17.

The solder ball 19 is disposed on the redistribution structure 18. The solder ball 19 is electrically connected to the conductive element 15 via the first interconnection 16. The solder ball 19 is electrically connected to the die 12 via the second interconnection 17.

Similar to the structure of the lower encapsulation layer 10 depicted in FIG. 1, the lower encapsulation layer 10 may function as a mold compound carrier for supporting the die 12. The lower encapsulation layer 10 is adjacent to the insulation layer 14, and is disposed under the upper encapsulation layer 13 and the adhesive layer 11. The lower encapsulation layer 10 includes an epoxy resin and fillers 21. A thickness of the lower encapsulation layer 10 can be set as appropriate. The thickness of the lower encapsulation layer 10 can be readily changed. For example, in some embodiments, the bottom surface 102 of the lower encapsulation layer 10 can be grinded. A contact angle of the bottom surface 102 of the lower encapsulation layer 10 is different from a contact angle of the top surface 101 of the lower encapsulation layer 10. For example, a contact angle of the bottom surface 102 of the lower encapsulation layer 10 is less than a contact angle of the top surface 101 of the lower encapsulation layer 10. In some embodiments, the top surface 101 of the lower encapsulation layer 10 can be grinded. The contact angle of the bottom surface 102 of the lower encapsulation layer 10 is different from a contact angle of the lateral surface 103 or 104 of the lower encapsulation layer 10. For example, the contact angle of the bottom surface 102 of the lower encapsulation layer 10 is less than a contact angle of the lateral surface 103 or 104 of the lower encapsulation layer 10.

The upper encapsulation layer 13 includes an epoxy resin. Material characteristics of the upper encapsulation layer 13 may be similar to those of the lower encapsulation layer 10. In some embodiments, a CTE of the upper encapsulation layer 13 is different from a CTE of the lower encapsulation layer 10. In some embodiments, the CTE of the upper encapsulation layer 13 is substantially the same as the CTE of the lower encapsulation layer 10. In some embodiments, the CTE of the upper encapsulation layer 13 is greater than the CTE of the lower encapsulation layer 10. In some embodiments, the CTE of the upper encapsulation layer 13 is less than the CTE of the lower encapsulation layer 10. In implementations in which the material characteristics (e.g. CTEs) of the upper encapsulation layer 13 are similar or substantially the same as those of the lower encapsulation layer 10, CTE mismatch between the upper encapsulation layer 13 and the lower encapsulation layer 10 can be kept small. Thus the strength of the lower encapsulation layer 10 used as a mold compound carrier may be increased and the reliability of the lower encapsulation layer 10 can be stable during molding operations, which can help to avoid warpage issues and reduce the costs for manufacturing the semiconductor device package 3.

FIG. 5A through FIG. 5E illustrate some embodiments of a method of manufacturing the semiconductor device package 1 according to some embodiments of the present disclosure.

Figure 5A:
FIG. 5A illustrates some embodiments of a method of manufacturing a semiconductor device package according to some embodiments of the present disclosure.

Referring to FIG. 5A, the method for manufacturing the semiconductor device package 1 includes providing a first lower encapsulation layer 10". In some embodiments, the top surface of the lower encapsulation layer 10" may be pre-grinded.

Figure 5B:
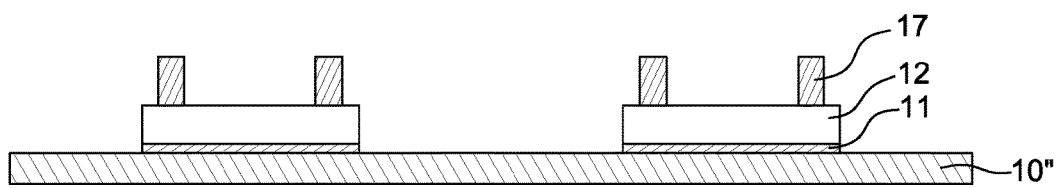
FIG. 5B illustrates some embodiments of a method of manufacturing a semiconductor device package according to some embodiments of the present disclosure.

Referring to FIG. 5B, the adhesive layer 11 is formed on or applied to the first lower encapsulation layer 10". The die 12 is attached to the first lower encapsulation layer 10" via the adhesive layer 11. The interconnection 17 is formed or disposed on the die 12. Subsequently, a prebaking operation is performed. A temperature at which at least a part of the prebaking operation is performed is in a range from approximately 100° C. to approximately 130° C.

Figure 5C:
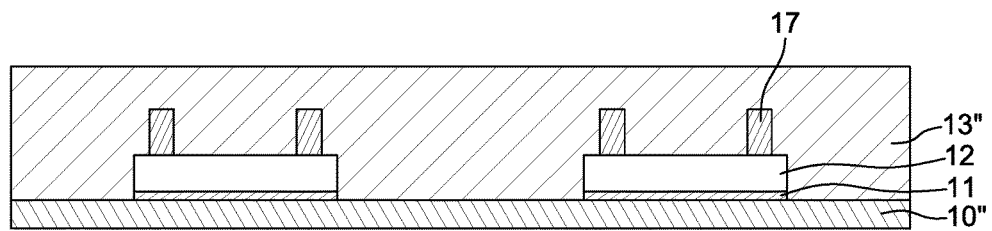
FIG. 5C illustrates some embodiments of a method of manufacturing a semiconductor device package according to some embodiments of the present disclosure.

Referring to FIG. 5C, the first upper encapsulation layer 13" is formed on the first lower encapsulation layer 10" to encapsulate the adhesive layer 11, the die 12, and the first lower encapsulation layer 10". Subsequently, a post-curing operation is performed. A temperature at which at least part of the post-curing operation is performed is in a range from approximately 120° C. to approximately 170° C.

Figure 5D:
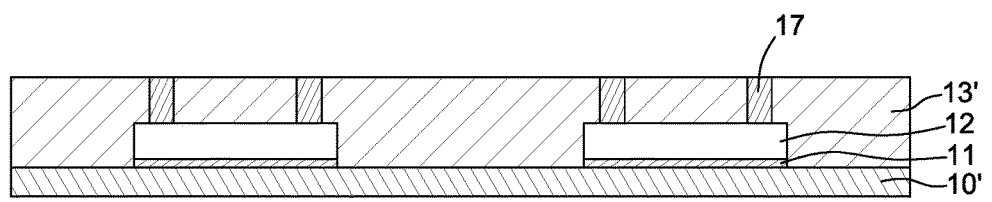
FIG. 5D illustrates some embodiments of a method of manufacturing a semiconductor device package according to some embodiments of the present disclosure.

Referring to FIG. 5D, the first upper encapsulation layer 13" is grinded by a grinding operation so as to expose the top surface of the interconnection 17. After the grinding operation, the first upper encapsulation layer 13" is thinned, and is hereinafter referred to as the second upper encapsulation layer 13'. Also, the first lower encapsulation layer 10" is grinded by a grinding operation. After the grinding operation, the first lower encapsulation layer 10" is thinned and is referred to hereinafter as the second lower encapsulation layer 10'.

Figure 5E:
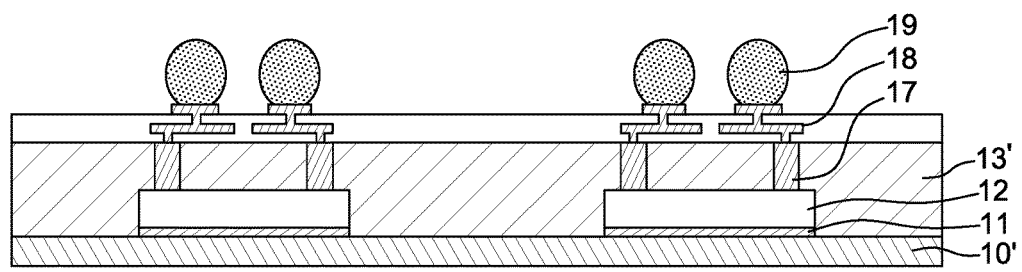
FIG. 5E illustrates some embodiments of a method of manufacturing a semiconductor device package according to some embodiments of the present disclosure.

Referring to FIG. 5E, the redistribution structure 18 is formed or disposed on the second upper encapsulation layer 13'. Subsequently, the solder ball 19 is formed or disposed on the redistribution structure 18. Finally, a singulation operation is performed, thus completing fabrication of the semiconductor device package 1. In some embodiments, further operations may be performed to complete fabrication of the semiconductor device package 1. Since the lower encapsulation layer 10' is used as a mold compound carrier for supporting the die 12, extra bonding and de-bonding operations used in some comparative implementations that make use of metal carriers or glass carriers may be omitted. Additionally, since the lower encapsulation layer 10' may be softer than a metal carrier or a glass carrier, the lower encapsulation layer 10' is readily thinned and singulated.

FIG. 6A through FIG. 6K illustrate some embodiments of a method of manufacturing the semiconductor device package 2 according to some embodiments of the present disclosure.

Figure 6A:
FIG. 6A illustrates some embodiments of a method of manufacturing a semiconductor device package according to some embodiments of the present disclosure.

Referring to FIG. 6A, the method for manufacturing the semiconductor device package 2 includes providing a first lower encapsulation layer 10". In some embodiments, the top surface of the lower encapsulation layer 10" may be pre-grinded.

Figure 6B:
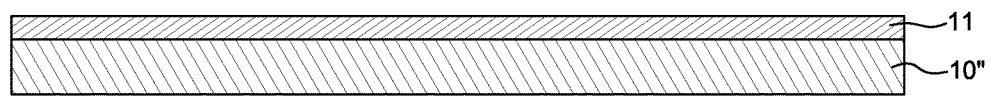
FIG. 6B illustrates some embodiments of a method of manufacturing a semiconductor device package according to some embodiments of the present disclosure.

Referring to FIG. 6B, the adhesive layer 11 is formed on or applied to the first lower encapsulation layer 10".

Figure 6C:
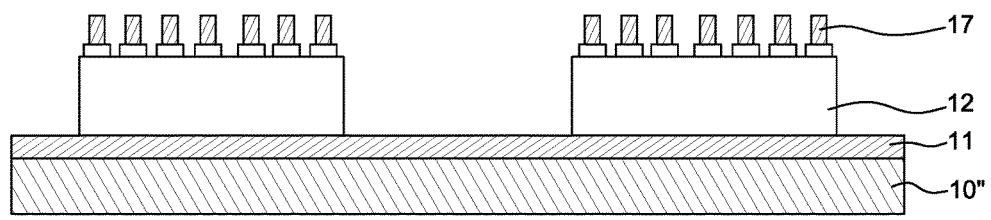
FIG. 6C illustrates some embodiments of a method of manufacturing a semiconductor device package according to some embodiments of the present disclosure.

Referring to FIG. 6C, the die 12 is attached to the first lower encapsulation layer 10" via the adhesive layer 11. The interconnection 17 is formed on or disposed on the die 12.

Figure 6D:
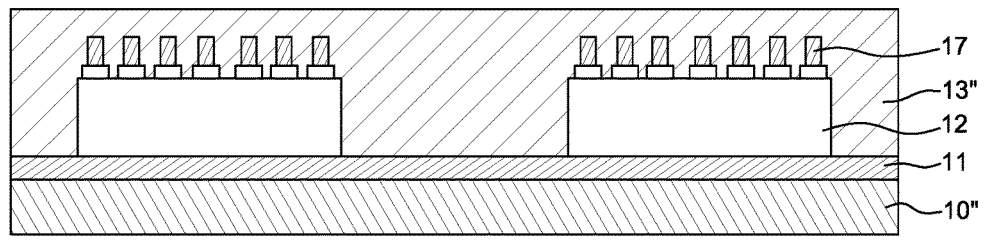
FIG. 6D illustrates some embodiments of a method of manufacturing a semiconductor device package according to some embodiments of the present disclosure.

Referring to FIG. 6D, the first upper encapsulation layer 13" is formed on the adhesive layer 11 to encapsulate the adhesive layer 11 and the die 12.

Figure 6E:
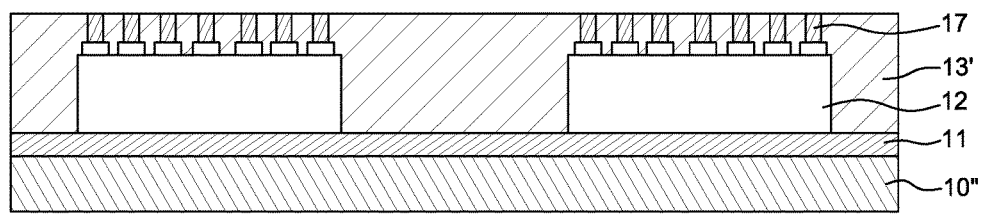
FIG. 6E illustrates some embodiments of a method of manufacturing a semiconductor device package according to some embodiments of the present disclosure.

Referring to FIG. 6E, the first upper encapsulation layer 13" is grinded by a grinding operation so as to expose the top surface of the interconnection 17. After the grinding operation, the first upper encapsulation layer 13" is thinned and is referred to hereinafter as the second upper encapsulation layer 13'.

Figure 6F:
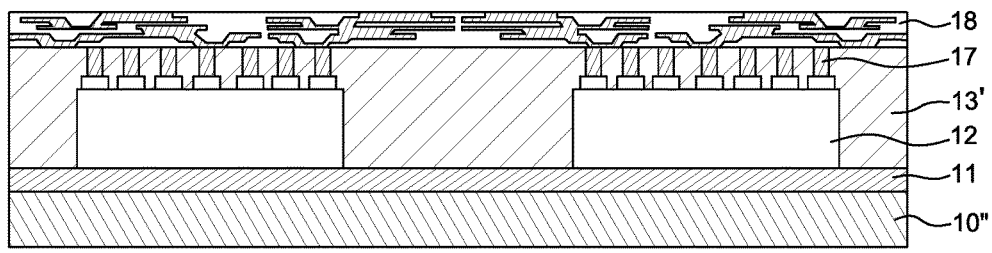
FIG. 6F illustrates some embodiments of a method of manufacturing a semiconductor device package according to some embodiments of the present disclosure.

Referring to FIG. 6F, the redistribution structure 18 is formed or disposed on the second upper encapsulation layer 13'.

Figure 6G:
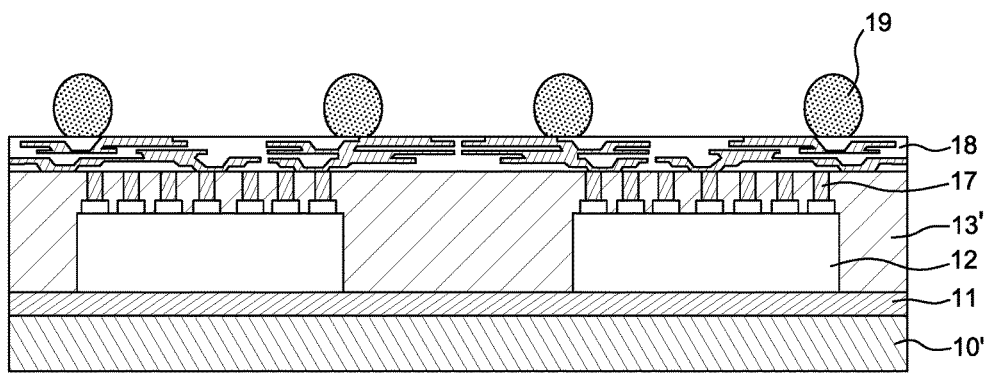
FIG. 6G illustrates some embodiments of a method of manufacturing a semiconductor device package according to some embodiments of the present disclosure.

Referring to FIG. 6G, the solder ball 19 is formed or disposed on the redistribution structure 18.

Figure 6H:
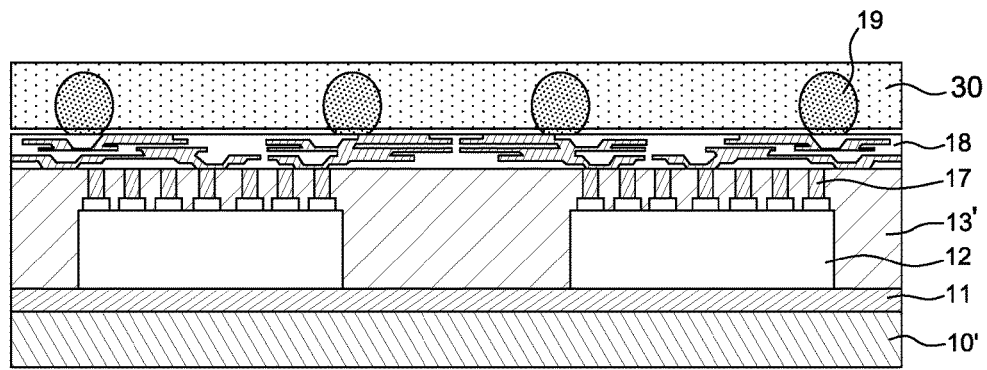
FIG. 6H illustrates some embodiments of a method of manufacturing a semiconductor device package according to some embodiments of the present disclosure.

Referring to FIG. 6H, a tape 30 is disposed on the redistribution structure 18 to protect the solder ball 19.

Figure 6I:
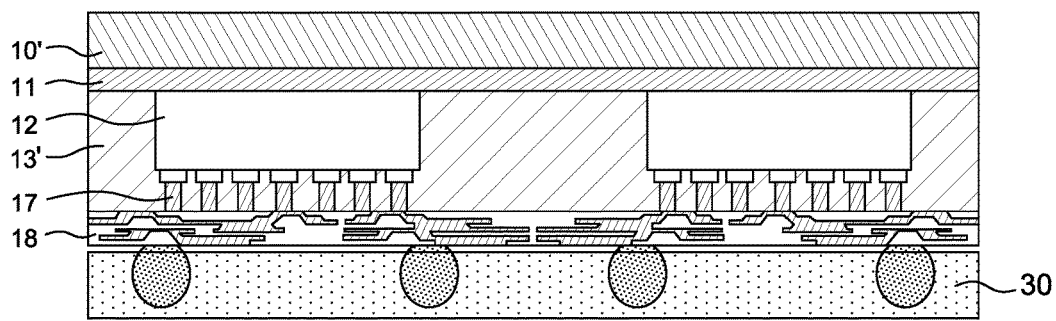
FIG. 6I illustrates some embodiments of a method of manufacturing a semiconductor device package according to some embodiments of the present disclosure.

Referring to FIG. 6I, the first lower encapsulation layer 10" is grinded by a grinding operation. After the grinding operation, the first lower encapsulation layer 10" is thinned and is referred to hereinafter as the second lower encapsulation layer 10'.

Figure 6J:
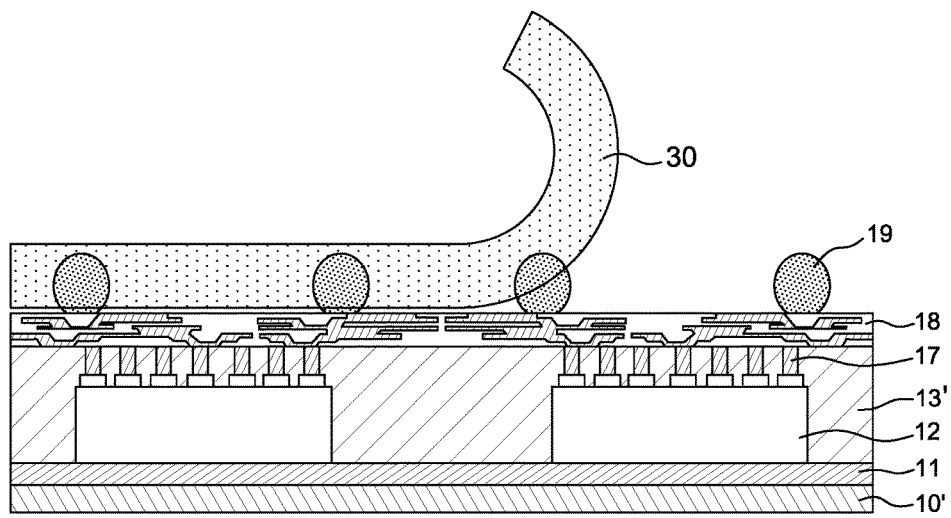
FIG. 6J illustrates some embodiments of a method of manufacturing a semiconductor device package according to some embodiments of the present disclosure.

Referring to FIG. 6J, the tape 30 is removed by a de-taping operation so as to expose the solder ball 19.

Figure 6K:
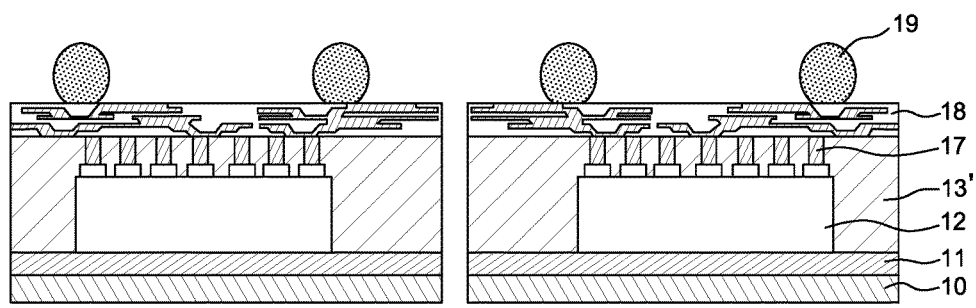
FIG. 6K illustrates some embodiments of a method of manufacturing a semiconductor device package according to some embodiments of the present disclosure.

Referring to FIG. 6K, a singulation operation is performed thus completing fabrication of the semiconductor device package 2. In some embodiments, further operations are performed to complete fabrication of the semiconductor device package 2. Since the lower encapsulation layer 10' is used as a mold compound carrier for supporting the die 12, extra bonding and de-bonding operations used in some comparative implementations that make use of metal carriers or glass carriers may be omitted. Additionally, since the lower encapsulation layer 10' is softer than that of a metal carrier or a glass carrier, the lower encapsulation layer 10' is readily thinned and singulated.

FIG. 7A through FIG. 7M illustrate some embodiments of a method of manufacturing the semiconductor device package 3 according to some embodiments of the present disclosure.

Figure 7A:
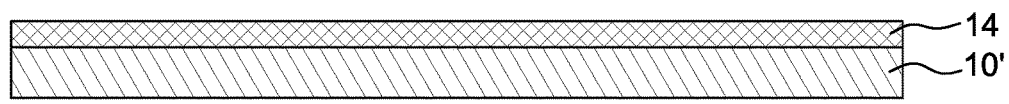
FIG. 7A illustrates some embodiments of a method of manufacturing a semiconductor device package according to some embodiments of the present disclosure.

Referring to FIG. 7A, the method for manufacturing the semiconductor device package 3 includes providing a first lower encapsulation layer 10'. In some embodiments, the top surface of the first lower encapsulation layer 10' may be pre-grinded. The insulation layer 14 is formed or disposed directly on the first lower encapsulation layer 10'.

Figure 7B:
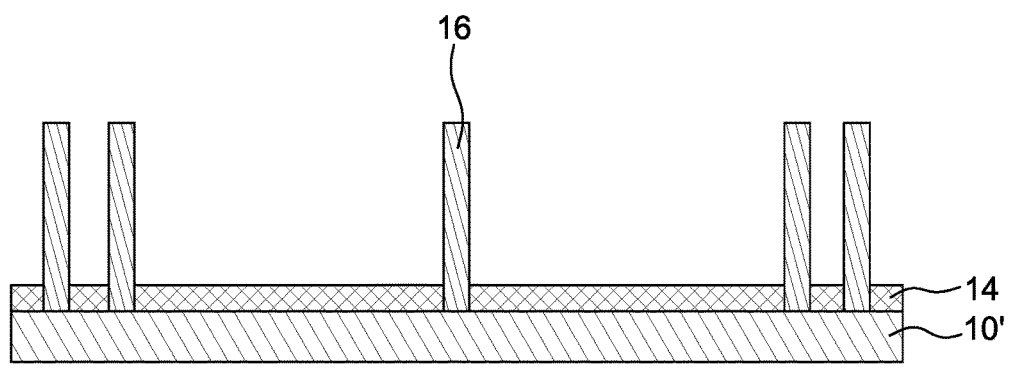
FIG. 7B illustrates some embodiments of a method of manufacturing a semiconductor device package according to some embodiments of the present disclosure.

Referring to FIG. 7B, an opening is formed in the insulation layer 14 by, for example, a laser drilling technique so as to expose the first lower encapsulation layer 10'. In some embodiments, the opening may be formed in the insulation layer 14 by a photolithography technique including an etching technique. Then, a seed layer is formed in the opening of the insulation layer 14. Subsequently, the first interconnection 16 is formed on the seed layer.

Figure 7C:
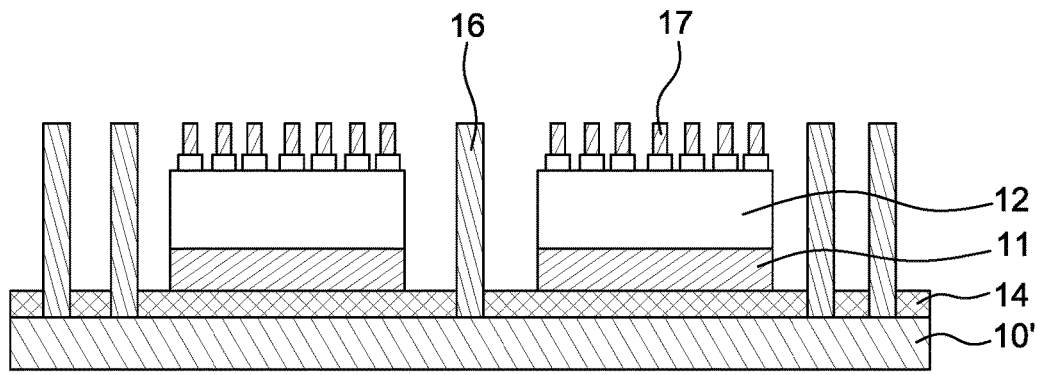
FIG. 7C illustrates some embodiments of a method of manufacturing a semiconductor device package according to some embodiments of the present disclosure.

Referring to FIG. 7C, an adhesive layer 11 is formed on or applied to the insulation layer 14. The die 12 is attached to the insulation layer 14 via the adhesive layer 11. The second interconnection 17 is formed on or disposed on the die 12.

Figure 7D:
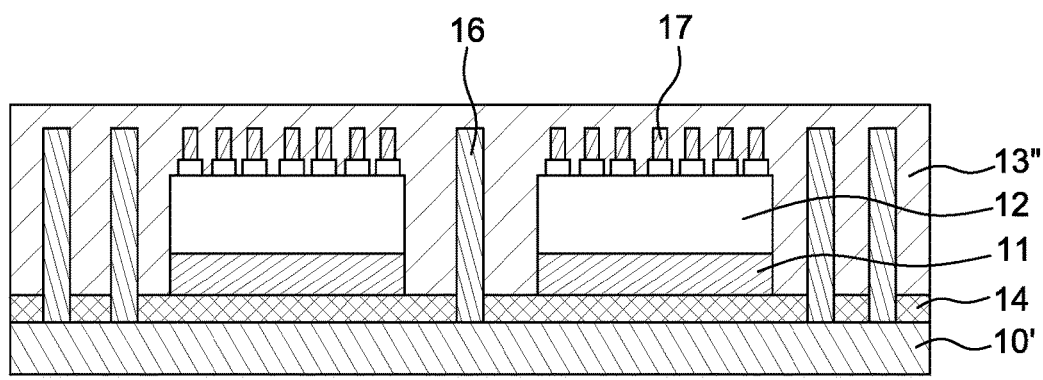
FIG. 7D illustrates some embodiments of a method of manufacturing a semiconductor device package according to some embodiments of the present disclosure.

Referring to FIG. 7D, the first upper encapsulation layer 13" is formed on the insulation layer 14 to encapsulate the adhesive layer 11, the die 12, and the insulation layer 14. Subsequently, a curing operation is performed. A temperature at which at least part of the curing operation is performed is in a range from approximately 120° C. to approximately 170° C.

Figure 7E:
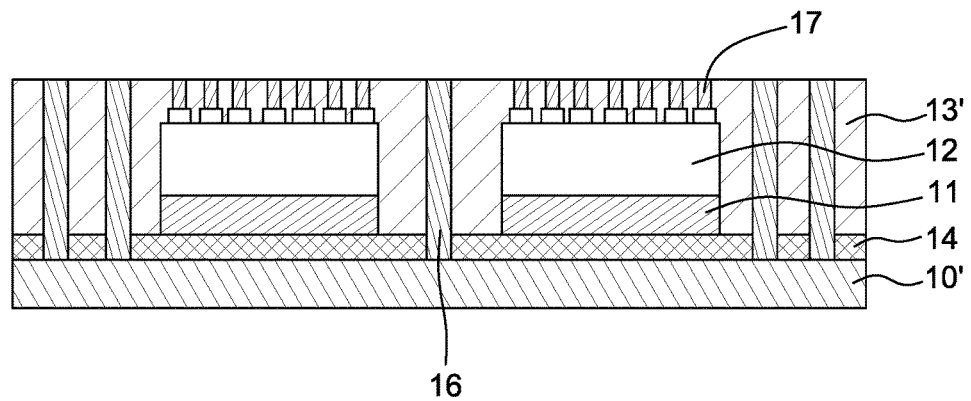
FIG. 7E illustrates some embodiments of a method of manufacturing a semiconductor device package according to some embodiments of the present disclosure.

Referring to FIG. 7E, the first upper encapsulation layer 13" is grinded by a grinding operation so as to expose the top surface of the first interconnection 16 and the top surface of the second interconnection 17. After the grinding operation, the first upper encapsulation layer 13" is thinned and is referred to hereinafter as the second upper encapsulation layer 13'.

Figure 7F:
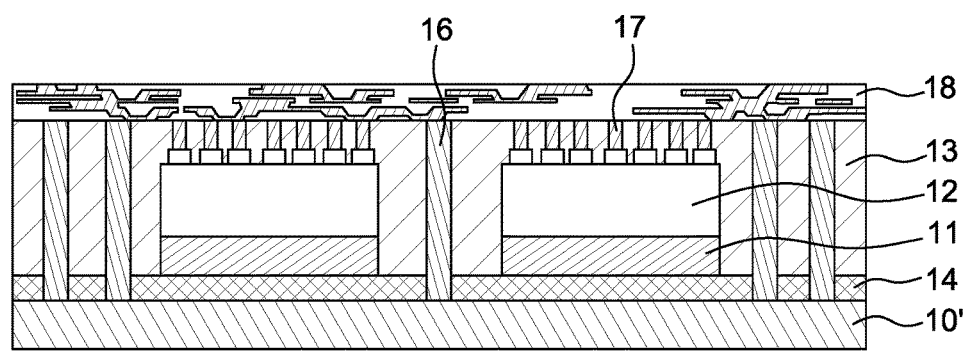
FIG. 7F illustrates some embodiments of a method of manufacturing a semiconductor device package according to some embodiments of the present disclosure.

Referring to FIG. 7F, the redistribution structure 18 is formed or disposed on the second upper encapsulation layer 13'.

Figure 7G:
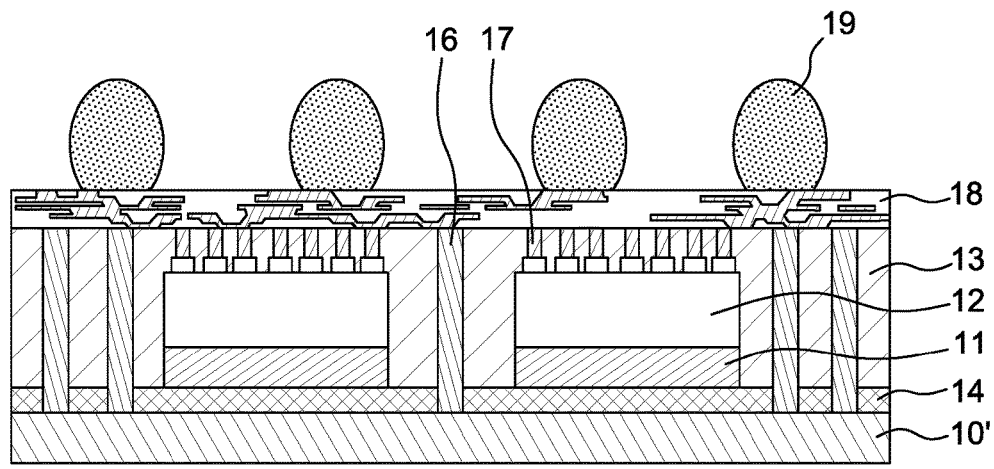
FIG. 7G illustrates some embodiments of a method of manufacturing a semiconductor device package according to some embodiments of the present disclosure.

Referring to FIG. 7G, the solder ball 19 is formed or disposed on the redistribution structure 18.

Figure 7H:
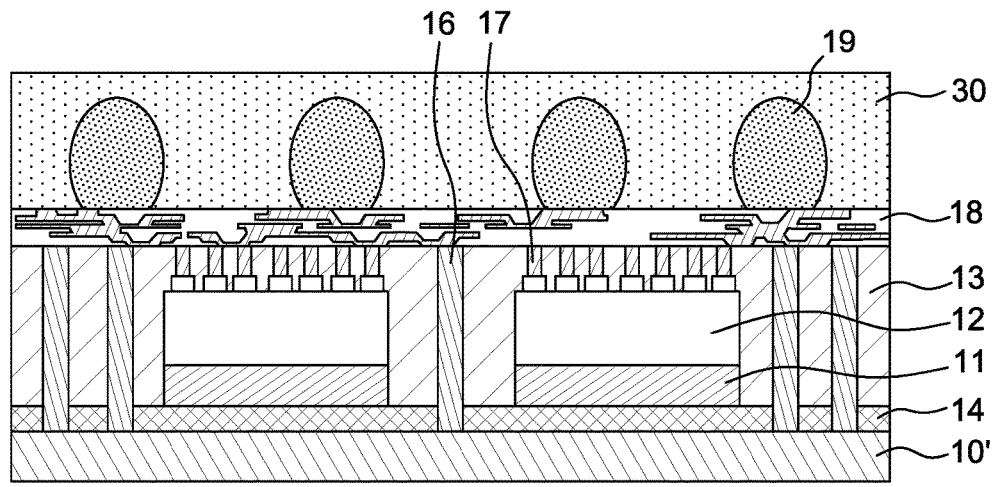
FIG. 7H illustrates some embodiments of a method of manufacturing a semiconductor device package according to some embodiments of the present disclosure.

Referring to FIG. 7H, a tape 30 is disposed on the redistribution structure 18 to protect the solder ball 19.

Figure 7I:
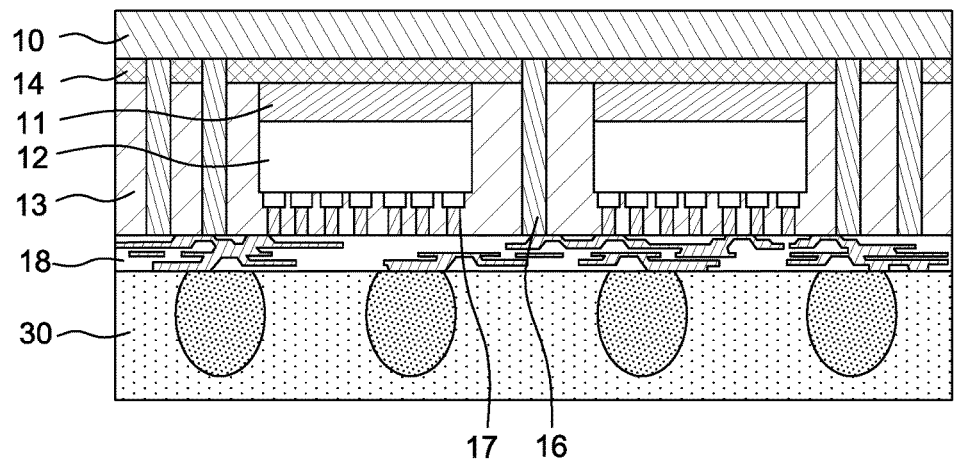
FIG. 7I illustrates some embodiments of a method of manufacturing a semiconductor device package according to some embodiments of the present disclosure.

Referring to FIG. 7I, the first lower encapsulation layer 10' is grinded by a grinding operation. After the grinding operation, the first lower encapsulation layer 10' is thinned and is referred to hereinafter as the lower encapsulation layer 10.

Figure 7J:
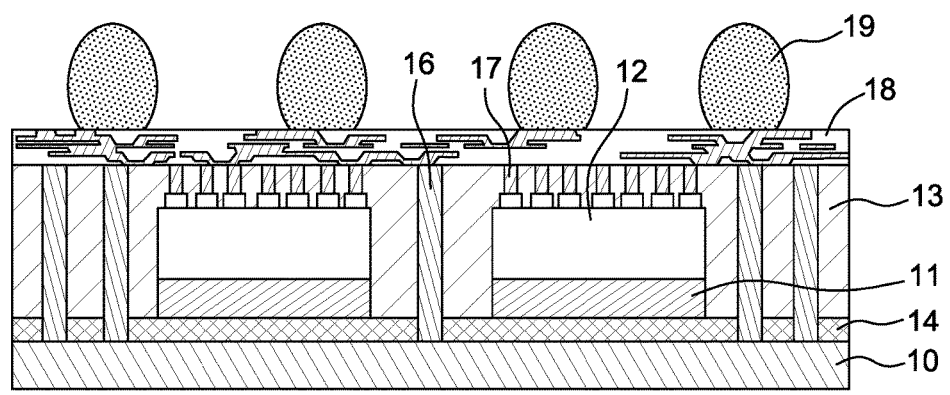
FIG. 7J illustrates some embodiments of a method of manufacturing a semiconductor device package according to some embodiments of the present disclosure.

Referring to FIG. 7J, the tape 30 is removed by a de-taping operation so as to expose the solder ball 19.

Figure 7K:
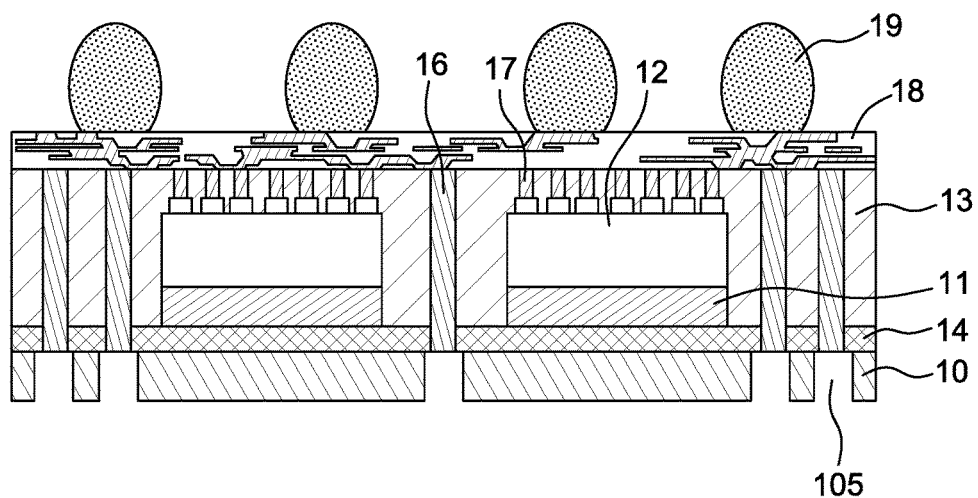
FIG. 7K illustrates some embodiments of a method of manufacturing a semiconductor device package according to some embodiments of the present disclosure.

Referring to FIG. 7K, an opening 105 is formed in the lower encapsulation layer 10 by, for example, a laser drilling technique so as to expose the insulation layer 14 and the first interconnection 16. In some embodiments, the opening 105 may be formed in the lower encapsulation layer 10 by a photolithography technique including an etching technique. Subsequently, a seed layer is formed in the opening 105 of the lower encapsulation layer 10.

Figure 7L:
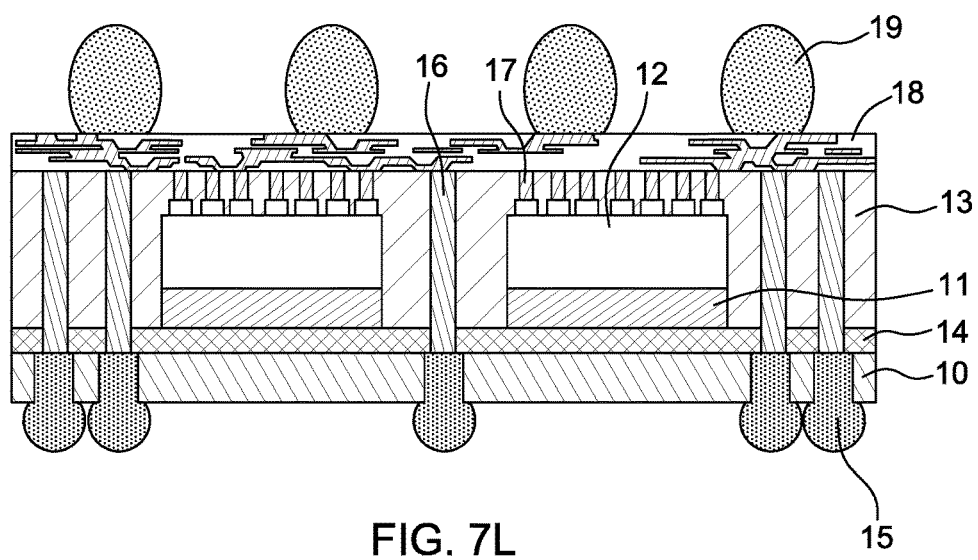
FIG. 7L illustrates some embodiments of a method of manufacturing a semiconductor device package according to some embodiments of the present disclosure.

Referring to FIG. 7L, the conductive element 15 is formed or disposed in the opening 105 and exposed from the lower encapsulation layer 10. In some embodiments, the conductive element 15 may include a solder paste, a solder ball, a joint material, or other suitable elements. In some embodiments, a singulation operation may be subsequently performed.

Figures 7M, 8:
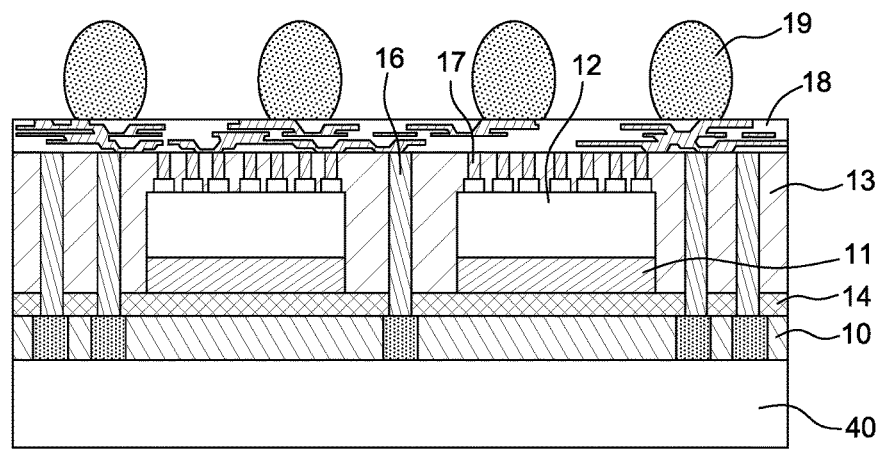
FIG. 7M illustrates some embodiments of a method of manufacturing a semiconductor device package according to some embodiments of the present disclosure.
FIG. 8 illustrates a table of contact angles of the surfaces of carriers according to some embodiments of the present disclosure.

Referring to FIG. 7M, a second die 40 may be additionally disposed on the lower encapsulation layer 10. In some embodiments, the second die 40 may include a memory device or a semiconductor device stack.

FIG. 8 is a table of contact angles, with respect to water, of the surfaces of a silicon wafer and the lower encapsulation layer 10 according to some embodiments of the present disclosure. The value of a contact angle of at least one surface of the silicon wafer without any grinding operation is in a range from approximately 63° to approximately 69°. The value of a contact angle of at least one surface of the lower encapsulation layer 10 (e.g. at least one of the top surface 101, the bottom surface 102, the lateral surface 103, and the lateral surface 104) without curing and grinding operations is in a range from approximately 92° to approximately 108°. The value of a contact angle of the at least one surface of the lower encapsulation layer 10 treated with a curing operation but without any grinding operation is in a range from approximately 92° to approximately 105°. The value of a contact angle of the at least one surface of the lower encapsulation layer 10 without any curing operation but treated with a grinding operation is in a range from approximately 36° to approximately 39°. The value of a contact angle of the at least one surface of the lower encapsulation layer 10 treated with curing and grinding operations is in a range from approximately 39° to approximately 41°.

FIG. 9 is a table of contact angles of at least one surface of the lower encapsulation layer 10 (e.g. at least one of the top surface 101, the bottom surface 102, the lateral surface 103, and the lateral surface 104) according to some embodiments of the present disclosure. The value of a contact angle of the at least one surface of the lower encapsulation layer 10 without any grinding operation is approximately 104.4°. The value of a contact angle of the at least one surface of the lower encapsulation layer 10 treated with a singulation operation by a saw is approximately 55.7°. The value of a contact angle of the at least one surface of the lower encapsulation layer 10 treated with a grinding operation is approximately 39.5°.

FIG. 10 is a table of roughness values of at least one surface (e.g. at least one of the top surface 101, the bottom surface 102, the lateral surface 103, and the lateral surface 104) of the lower encapsulation layer 10 according to some embodiments of the present disclosure. The value of a roughness of the at least one surface of the lower encapsulation layer 10 without any grinding operation is approximately 0.279 μm. The value of a roughness of the at least one surface of the lower encapsulation layer 10 treated with a singulation operation by a saw is approximately 0.214 μm. The value of a roughness of the at least one surface of the lower encapsulation layer 10 treated with a grinding operation is approximately 0.091 μm.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" or "coplanar" can refer to two surfaces within micrometers of lying along a same plane, such as within 40 μm, within 30 μm, within 20 μm, within 10 μm, or within 1 μm of lying along the same plane. A surface can be deemed to be "substantially planar" or "planar" if a difference between a highest point and a lowest point of the surface is no greater than 1 μm, no greater than 8 μm, or no greater than 10 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
an adhesive layer;
a die disposed on the adhesive layer;
a first encapsulation layer encapsulating the die and the adhesive layer; and
a second encapsulation layer adjacent to the adhesive layer and disposed under the first encapsulation layer, the second encapsulation layer having a first surface and a second surface different from the first surface, wherein a contact angle of the first surface of the second encapsulation layer is different from a contact angle of the second surface of the second encapsulation layer.

2. The semiconductor device package of claim 1, wherein a coefficient of thermal expansion (CTE) of the first encapsulation layer is greater than a CTE of the second encapsulation layer.

3. The semiconductor device package of claim 1, further comprising a conductive element, wherein the second encapsulation layer defines an opening to receive the conductive element.

4. The semiconductor device package of claim 3, further comprising a redistribution structure disposed on the first encapsulation layer, and an interconnection disposed in the first encapsulation layer and electrically connected to the conductive element and to the redistribution structure.

5. The semiconductor device package of claim 1, further comprising an insulation layer disposed between the first encapsulation layer and the second encapsulation layer.

6. The semiconductor device package of claim 5, wherein a lateral surface of the second encapsulation layer is substantially coplanar with a lateral surface of the insulation layer.

7. The semiconductor device package of claim 1, wherein a surface roughness of the second surface of the second encapsulation layer is different from a surface roughness of the first surface of the second encapsulation layer.

8. A semiconductor device package, comprising:
an adhesive layer;
a die disposed on the adhesive layer;
a first encapsulation layer encapsulating the die and the adhesive layer; and
a second encapsulation layer adjacent to the adhesive layer and disposed under the first encapsulation layer, the second encapsulation layer having a first surface and comprising a first filler having a planar surface,
wherein the planar surface of the first filler is coplanar with the first surface of the second encapsulation layer.

9. The semiconductor device package of claim 8, wherein a CTE of the first encapsulation layer is greater than a CTE of the second encapsulation layer.

10. The semiconductor device package of claim 8, further comprising a conductive element, wherein the second encapsulation layer defines an opening to receive the conductive element.

11. The semiconductor device package of claim 10, further comprising a redistribution structure disposed on the first encapsulation layer, and an interconnection disposed in the first encapsulation layer and electrically connected to the conductive element and to the redistribution structure.

12. The semiconductor device package of claim 8, further comprising an insulation layer disposed between the first encapsulation layer and the second encapsulation layer.

13. The semiconductor device package of claim 12, wherein a lateral surface of the second encapsulation layer is substantially coplanar with a lateral surface of the insulation layer.

14. The semiconductor device package of claim 8, wherein the second encapsulation layer further has a second surface different from the first surface, and wherein a surface roughness of the second surface of the second encapsulation layer is different from a surface roughness of the first surface of the second encapsulation layer.

15. The semiconductor device package of claim 4, wherein the interconnection is a first interconnection, and further comprising a second interconnection disposed in the first encapsulation layer and electrically connected to the die and to the redistribution structure.

16. The semiconductor device package of claim 15, further comprising a third interconnection disposed on the redistribution structure.

17. The semiconductor device package of claim 5, further comprising a redistribution structure disposed on the first encapsulation layer, a conductive element disposed in an opening of the second encapsulation layer, and an interconnection disposed in the first encapsulation layer and electrically connected to the conductive element and to the redistribution structure, the interconnection extending into the insulation layer.

18. The semiconductor device package of claim 11, wherein the interconnection is a first interconnection, and further comprising a second interconnection disposed in the first encapsulation layer and electrically connected to the die and to the redistribution structure.

19. The semiconductor device package of claim 18, further comprising a third interconnection disposed on the redistribution structure.

20. The semiconductor device package of claim 12, further comprising a redistribution structure disposed on the first encapsulation layer, a conductive element disposed in an opening of the second encapsulation layer, and an interconnection disposed in the first encapsulation layer and electrically connected to the conductive element and to the redistribution structure, the interconnection extending into the insulation layer.

* * * * *